(12) United States Patent
Park et al.

(10) Patent No.: US 12,238,989 B2
(45) Date of Patent: Feb. 25, 2025

(54) TRANSPARENT DISPLAY DEVICE

(71) Applicant: LG Display Co., Ltd., Seoul (KR)

(72) Inventors: Sunyoung Park, Paju-si (KR); Taehee Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 588 days.

(21) Appl. No.: 17/530,305

(22) Filed: Nov. 18, 2021

(65) Prior Publication Data

US 2022/0165837 A1 May 26, 2022

(30) Foreign Application Priority Data

Nov. 23, 2020 (KR) .................... 10-2020-0157799

(51) Int. Cl.
*H10K 59/131* (2023.01)
*H10K 71/00* (2023.01)

(52) U.S. Cl.
CPC ......... *H10K 59/131* (2023.02); *H10K 71/861* (2023.02)

(58) Field of Classification Search
CPC ............... H10K 59/131; H10K 71/861; H10K 59/1213; H01L 27/124; H01L 27/1222; G09G 3/3275
See application file for complete search history.

(56) References Cited

U.S. PATENT DOCUMENTS

| 10,236,335 B2 | 3/2019 | Oh et al. | |
| 2017/0345846 A1* | 11/2017 | Yang | H01L 27/1248 |
| 2018/0061908 A1* | 3/2018 | Shim | H10K 59/351 |
| 2018/0151661 A1* | 5/2018 | Oh | H10K 59/131 |
| 2019/0172884 A1* | 6/2019 | Shim | H10K 59/123 |
| 2021/0193765 A1* | 6/2021 | Kim | H10K 59/124 |

FOREIGN PATENT DOCUMENTS

KR 10-2018-0062516 A 6/2018

* cited by examiner

*Primary Examiner* — Andres Munoz
*Assistant Examiner* — Ashley Nicole Blackwell
(74) *Attorney, Agent, or Firm* — Seed IP Law Group LLP

(57) ABSTRACT

A transparent display device may minimize coupling occurring between signal lines and apply a repair structure to a scan line. The transparent display device comprises a substrate provided with a transmissive area and a non-transmissive area disposed between the transmissive areas, a reference line extended from the non-transmissive area in a first direction, a first data line disposed at a first side of the reference line, a second data line disposed at a second side of the reference line, a first power line provided between the reference line and the first data line, and a second power line provided between the reference line and the second data line.

20 Claims, 8 Drawing Sheets

TRANSPARENT DISPLAY DEVICE

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recently, studies for transparent display devices for allowing a user to look at objects or image arranged on an opposite side of a display device after transmitting the display device are actively ongoing.

A transparent display device includes a display area on which an image is displayed, and a non-display area, wherein the display area may include a transmissive area that may transmit external light, and a non-transmissive area. The transparent display device may have high light transmittance in the display area through the transmissive area.

BRIEF SUMMARY

The inventors of the present disclosure have recognized that the transparent display device has a technical problem of crosstalk that may occur due to coupling between a plurality of signal lines that are adjacent to each other in a non-transmissive area of the transparent display device.

The present disclosure has been made in view of various technical problems including the above problems, and various embodiments of the present disclosure provide a transparent display device that may minimize coupling occurring between signal lines.

It is another technical benefit of the present disclosure to provide a transparent display device that may apply a repair structure to a scan line.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a transparent display device comprising a substrate provided with a transmissive area and a non-transmissive area disposed between the transmissive areas, a reference line extended from the non-transmissive area in a first direction, a first data line disposed at a first side of the reference line, a second data line disposed at a second side of the reference line, a first power line provided between the reference line and the first data line, and a second power line provided between the reference line and the second data line.

In accordance with another aspect of the present disclosure, the above and other technical benefits can be accomplished by the provision of a transparent display device comprising a substrate provided with a transmissive area, a first non-transmissive area extended in a first direction between the transmissive areas, and a second non-transmissive area extended in a second direction between the transmissive areas, a reference line extended from the first non-transmissive area in the first direction, and a scan line extended from the second non-transmissive area in the second direction. The reference line includes a first line portion disposed at a first side of a first center line parallel with the first direction in the first non-transmissive area, a second line portion disposed at a second side of the first center line, and a bent portion connecting the first line portion with the second line portion.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
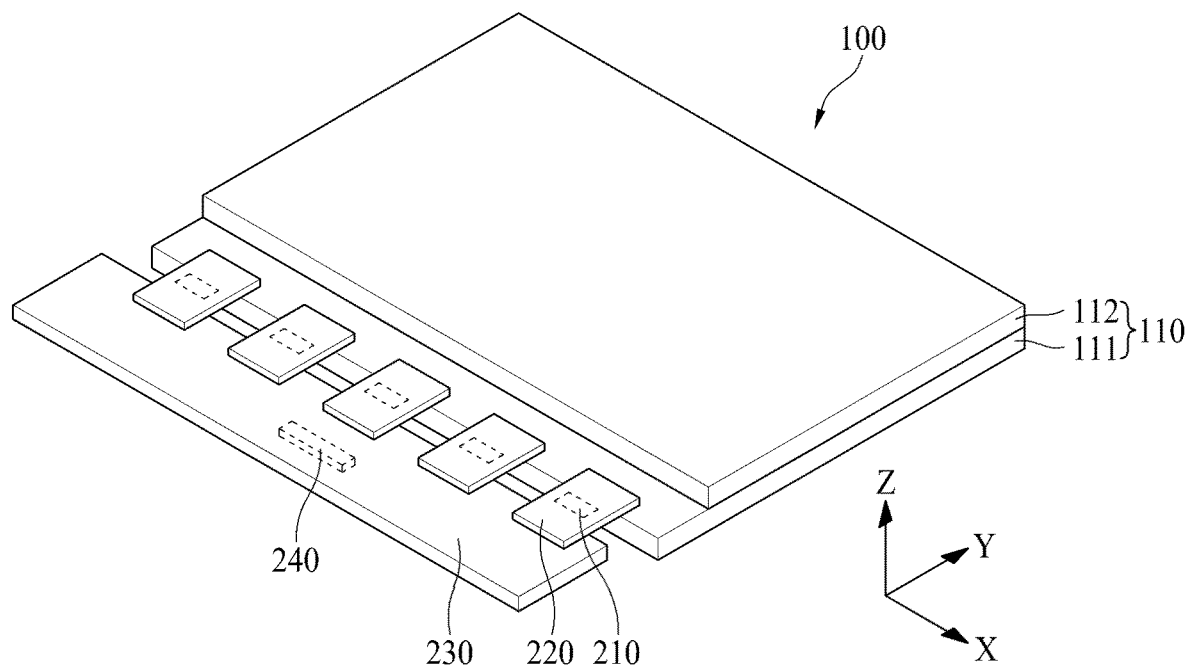
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X-axis indicates a line parallel with a scan line, Y-axis indicates a line parallel with a data line, and Z-axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED), or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the transparent display panel 110, or the non-display area of both peripheral sides of the transparent display panel 110 by a gate driver in panel (GIP) method. In another way, the scan driver may be manufactured in a driving chip, may be mounted on the flexible film, and may be attached to one peripheral side or both peripheral sides of the display area of the transparent display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the transparent display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
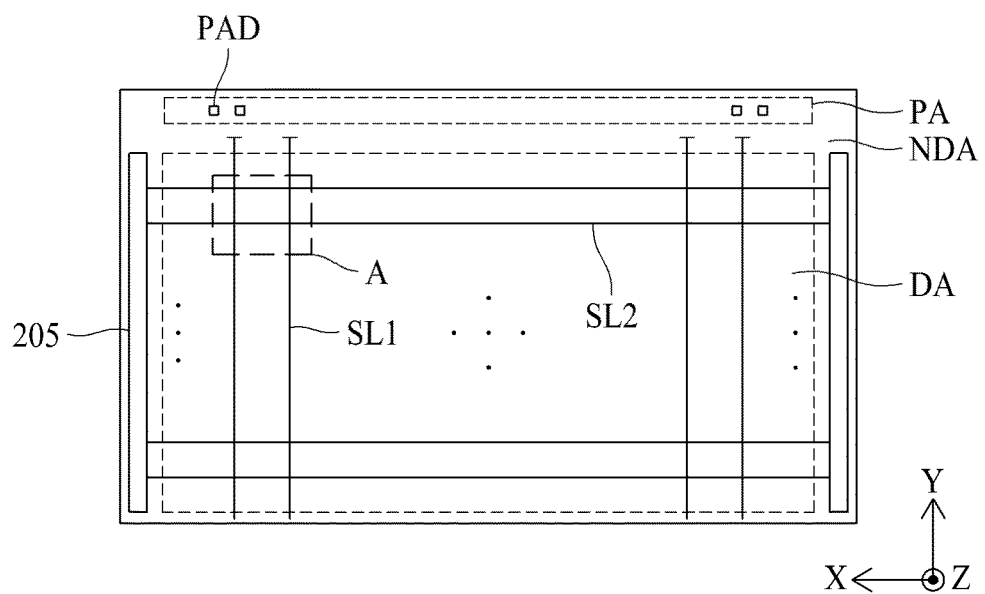
FIG. 2 is a schematic plane view illustrating a transparent display panel according to one embodiment of the present disclosure.
Figure 3:
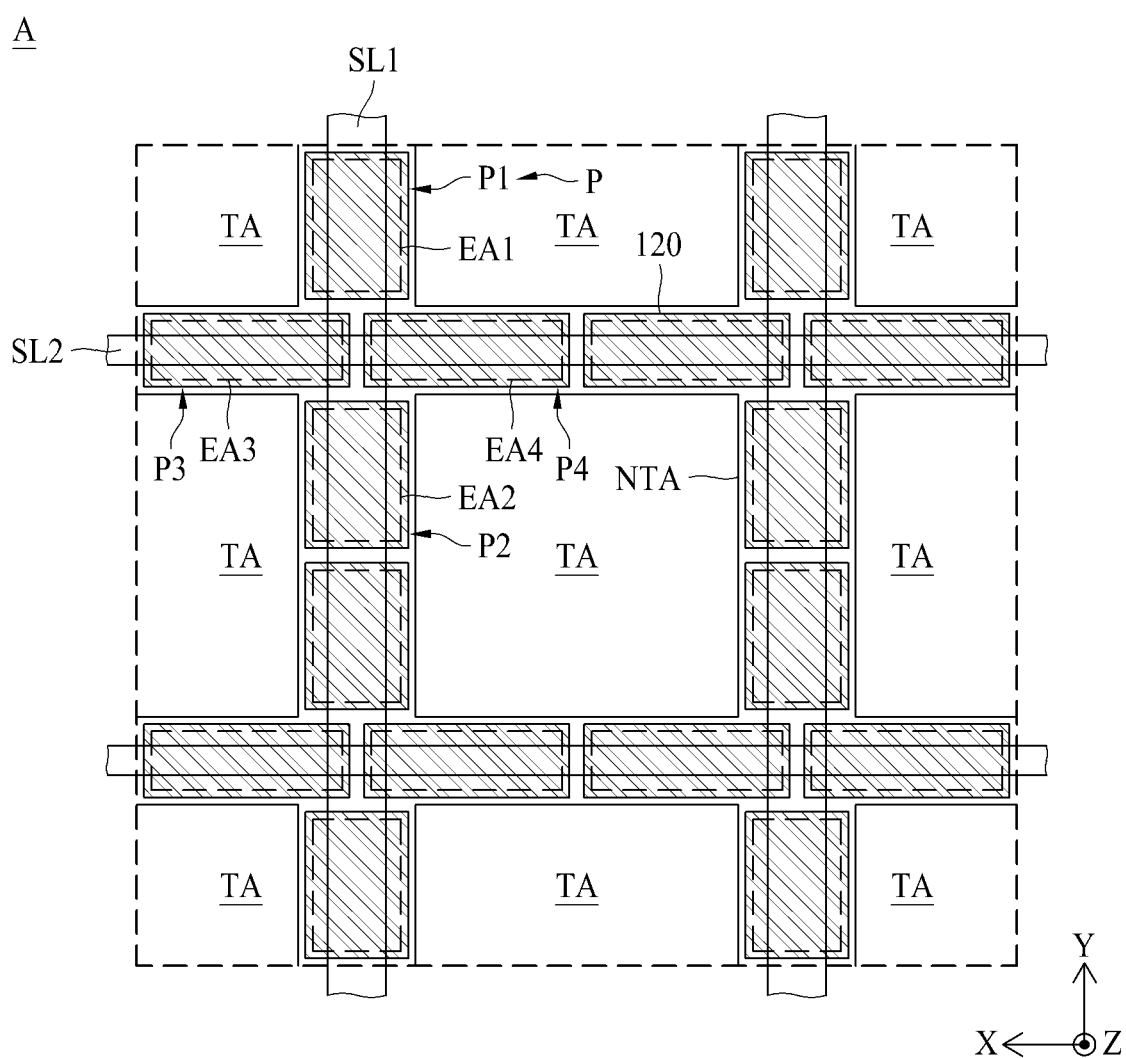
FIG. 3 is an enlarged view illustrating an area A of FIG. 2.
Figure 4:
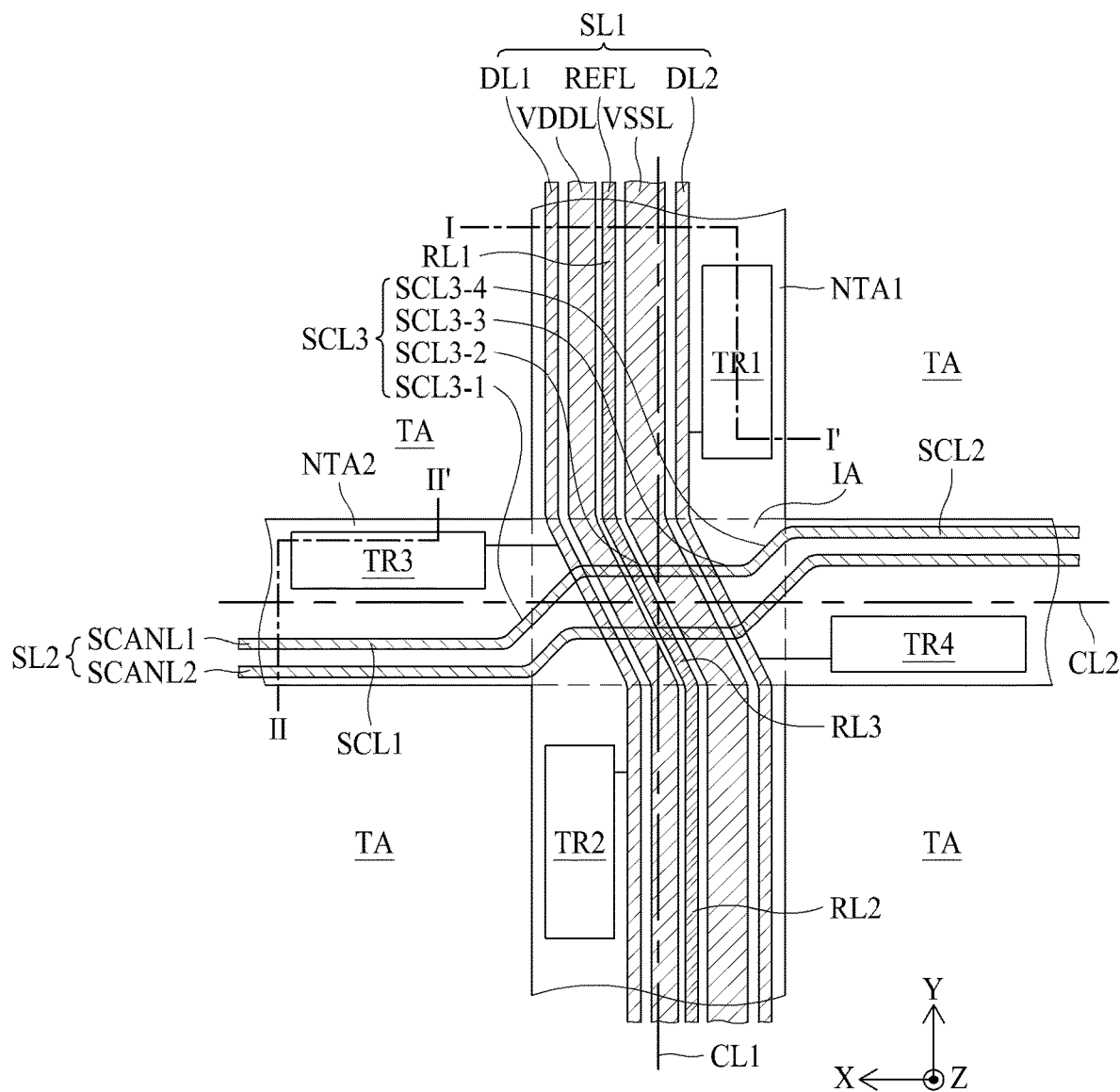
FIG. 4 is a view illustrating an example that a plurality of signal lines and a plurality of driving transistors are disposed.
Figure 5:
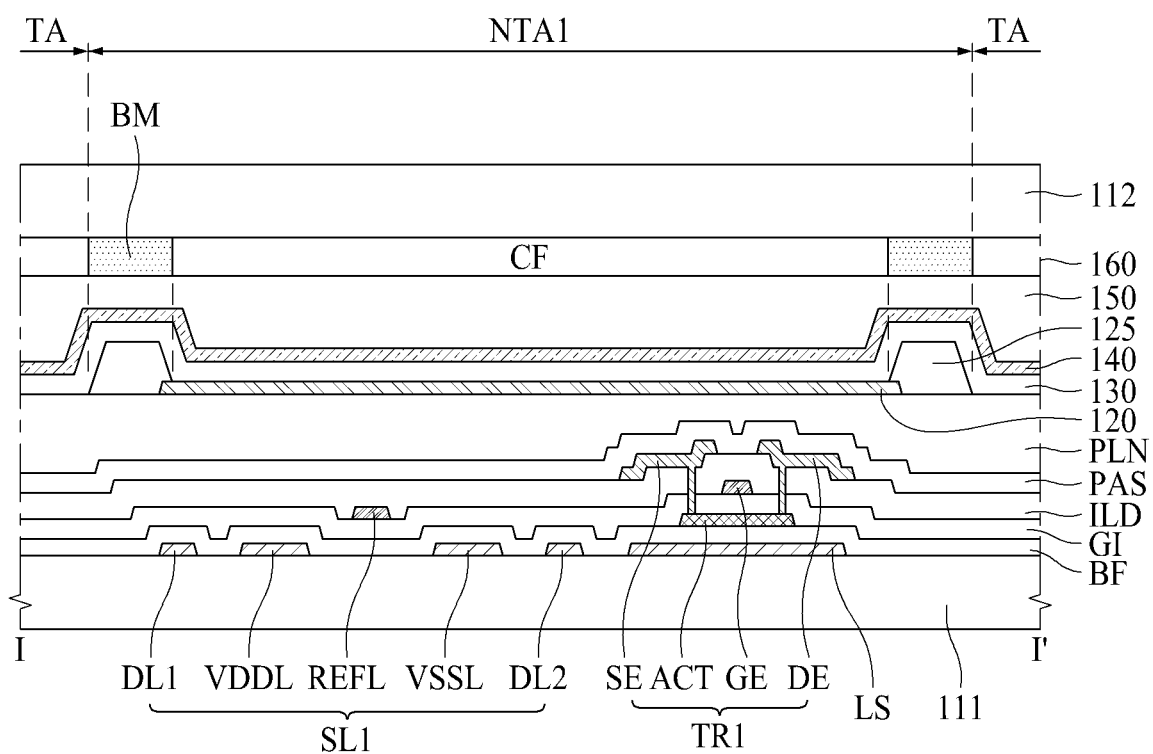
FIG. 5 is a cross-sectional view taken along line I-I' of FIG. 4.
Figure 6:
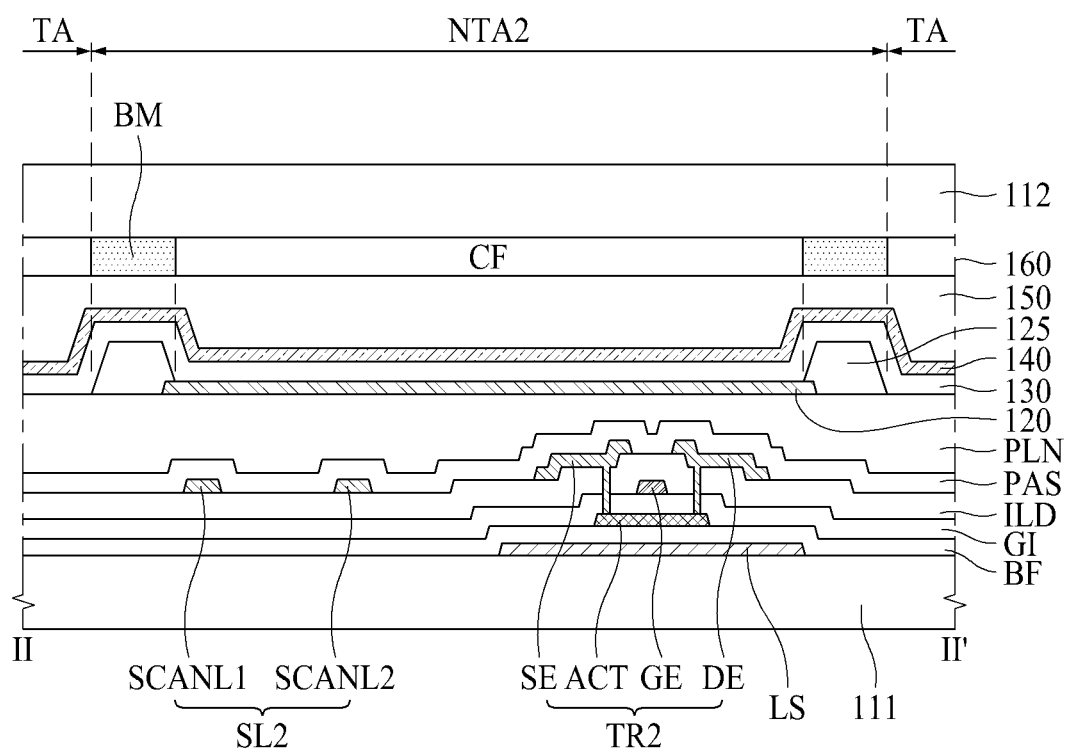
FIG. 6 is a cross-sectional view taken along line II-II' of FIG. 4.
Figure 7:
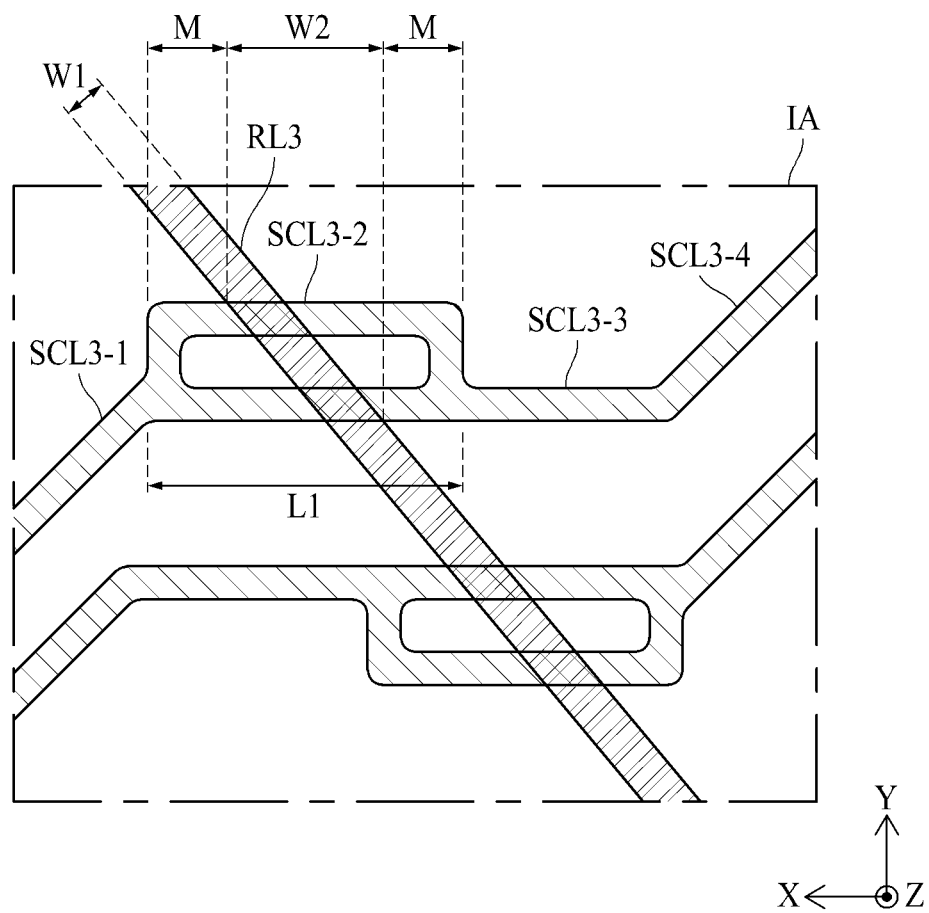
FIG. 7 is a view illustrating an example that a reference line and a scan line are disposed in an intersection area.

FIG. 2 is a schematic plane view illustrating a transparent display panel according to one embodiment of the present disclosure, and FIG. 3 is an enlarged view illustrating an area A of FIG. 2. FIG. 4 is a view illustrating an example that a plurality of signal lines and a plurality of driving transistors are disposed, FIG. 5 is a cross-sectional view taken along line I-I' of FIG. 4, and FIG. 6 is a cross-sectional view taken along line II-II' of FIG. 4. FIG. 7 is a view illustrating an example that a reference line and a scan line are disposed in an intersection area.

Referring to FIG. 2 and FIG. 7, a transparent display panel 110 may include a display area DA provided with pixels P to display an image, and a non-display area NDA for not displaying an image.

The non-display area NDA may be provided with a pad area PA in which pads PAD are disposed, and at least one scan driver 205.

The scan driver 205 are connected to the scan lines SL and supplies scan signals to the scan lines SL. The scan driver 205 may be disposed in one side of the display area DA of the transparent display panel 110, or the non-display area NDA of both peripheral sides of the transparent display panel 110 by a gate driver in panel (GIP) method. For example, as shown in FIG. 2, the scan driver 205 may be formed in both side of the display area DA of the transparent display panel 110, but these gate drivers are not limited thereto. The scan driver 205 may be formed only in one side of the display area DA of the transparent display panel 110.

The display area DA includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, about 90%, and the non-transmissive area NTA may be an area where light transmittance is smaller than β%, for example, about 50%. At this time, α is greater than β. A user may view an object or background arranged over a rear surface of the transparent display panel 110 due to the transmissive area TA.

A non-transmissive area NTA may be provided with a plurality of pixels P and a plurality of first signal lines SL1 and a plurality of second signal lines SL2 for supplying a signal to each of the plurality of pixels P.

A plurality of first signal lines SL1 may be extended in a first direction (e.g., Y-axis direction). Each of the plurality of first signal lines SL1 may include a first data line DL1, a pixel power line VDDL, a reference line REFL, a common power line VSSL, and a second data line DL2.

A plurality of second signal lines SL2 may be extended in a second direction (e.g., X-axis direction). The plurality of second signal lines SL2 may cross or overlap the plurality of first signal lines SL1. Each of the plurality of second signal lines SL2 may include at least one scan line SCANL1, SCANL2.

A transmissive area TA may be disposed between the first signal lines SL1 adjacent to each other. The transmissive area TA may also be disposed between the second signal lines SL2 adjacent to each other. That is, the transmissive area TA may be surrounded by two first signal lines SL1 and two second signal lines SL2.

Pixels P may be provided to overlap at least one of the first signal line SL1 or the second signal line SL2, thereby emitting predetermined light to display an image. An emission area EA may correspond to an area, from which light is emitted, in the pixel P.

Each of the pixels P may include at least one of a first subpixel P1, a second subpixel P2, a third subpixel P3 and a fourth subpixel P4. The first subpixel P1 may include a first emission area EA1 emitting light of a green color. The second subpixel P2 may include a second emission area EA2 emitting light of a red color. The third subpixel P3 may include a third emission area EA3 emitting light of a blue color. The fourth subpixel P4 may include a fourth emission area EA4 emitting light of a white color. However, the emission areas are not limited to this example. Each of the pixels P may further include a subpixel emitting light of a color other than red, green, blue and white.

Hereinafter, for convenience of description, the description will be given based on that a first subpixel P1 is a green subpixel emitting green light, a second subpixel P2 is a red subpixel emitting red light, a third subpixel P3 is a blue subpixel emitting blue light, and a fourth subpixel P4 is a white subpixel emitting white light.

A first subpixel P1 and a second subpixel P2 may be provided to overlap at least a part of the first signal line SL1 and alternately disposed along the first signal line SL1.

A third subpixel P3 and a fourth subpixel P4 may be provided to overlap at least a part of the second signal line SL2 and alternately disposed along the second signal line SL2.

The third subpixel P3 and the fourth subpixel P4 may be provided in the area where the first signal line SL1 and the second signal line SL2 cross or overlap each other, as shown in FIG. 3, but are not limited thereto.

In another embodiment, the first subpixel P1 and the second subpixel P2 may be provided in the area where the first signal line SL1 and the second signal line SL2 cross or overlap each other. In this case, the third subpixel P3 and the fourth subpixel P4 may be disposed to be spaced apart from each other with the first subpixel P1 and the second subpixel P2 interposed therebetween in the area where the first signal line SL1 and the second signal line SL2 cross or overlap each other.

A circuit element including a capacitor, a thin film transistor, etc., and a light emitting diode may be provided in each of the first subpixel P1, the second subpixel P2, the third subpixel P3 and the fourth subpixel P4. The thin film transistor may include a switching transistor, a sensing transistor, and a driving transistor TR.

The switching transistor is switched in accordance with scan signals supplied to the scan lines SCANL1 and SCANL2 to supply data voltages supplied from the data lines DL1 and DL2 to the driving transistor TR.

The sensing transistor serves to sense a threshold voltage deviation of the driving transistor TR, which causes deterioration of picture quality.

The driving transistor TR is switched in accordance with a data voltage supplied from a switching thin film transistor to generate a data current from a power source supplied from the pixel power line VDD, thereby serving to supply the generated data current to an anode electrode 120 of a subpixel. The driving transistor TR includes an active layer ACT, a gate electrode GE, a source electrode SE and a drain electrode DE.

The capacitor serves to maintain the data voltage supplied to the driving transistor TR for one frame. The capacitor may include a first capacitor electrode and a second capacitor electrode.

In detail, the active layer ACT may be provided over a first substrate 111. The active layer ACT may be formed of a silicon based semiconductor material or an oxide based semiconductor material.

A light shielding layer LS for shielding external light entering the active layer ACT may be provided between the active layer ACT and the first substrate 111 as shown in FIGS. 5 and 6. The light shielding layer LS may be made of a conductive material. For example, the light shielding layer LS may be formed of a single layer or a multi-layer made of any one of Mo, Al, Cr, Au, Ti, Ni, Nd and Cu, or their alloy. In this case, a buffer film BF may be provided between the light shielding layer LS and the active layer ACT.

A gate insulating layer GI may be provided over the active layer ACT. The gate insulating layer GI may be formed as an inorganic film, for example, a silicon oxide (SiOx) film, a silicon nitride (SiNx) film, or a multi-layered film of SiOx and SiNx.

A gate electrode GE may be provided over the gate insulating layer GI. The gate electrode GE may be formed of a single layer or a multi-layer made of any one of Mo, Al, Cr, Au, Ti, Ni, Nd and Cu or their alloy.

An inter-layer insulating layer ILD may be provided over the gate electrode GE. The inter-layer insulating layer ILD may be formed as an inorganic layer, for example, a silicon oxide (SiOx) layer, a silicon nitride (SiNx) layer, or a multi-layered layer of SiOx and SiNx.

Source and drain electrodes SE and DE may be provided over the inter-layer insulating layer ILD. One of the source and drain electrodes SE and DE may be connected to the active layer ACT through a second contact hole CH2 that passes through the gate insulating layer GI and the inter-layer insulating layer ILD.

The source and drain electrodes SE and DE may be formed of a single layer or a multi-layer made of any one of Mo, Al, Cr, Au, Ti, Ni, Nd and Cu or their alloy.

A passivation layer PAS may be provided over source and drain electrodes SE and DE for protecting the driving transistor TR. A planarization layer PLN may be provided over the passivation layer PAS to planarize a step difference caused by the driving transistor TR. The planarization layer PLN may be formed of an organic layer, for example, acryl resin, epoxy resin, phenolic resin, polyamide resin, polyimide resin, etc.

Light emitting diodes, which are comprised of the anode electrode 120, an organic light emitting layer 130, and a cathode electrode 140, and a bank 125 are provided over the planarization layer PLN.

An anode electrode 120 may be provided over a planarization layer PLN and connected with the driving transistor TR. In detail, the anode electrode 120 may be connected to the source electrode SE or the drain electrode DE of the driving transistor TR through a contact hole, the anode electrode 120 may electrically be connected with the driving transistor TR.

The anode electrode 120 may be provided for each of the subpixels P1, P2, P3 and P4. One anode electrode 120 may be provided in the first subpixel P1, another anode electrode 120 may be provided in the second subpixel P2, the other anode electrode 120 may be provide in the third subpixel P3, and the other anode electrode 120 may be provided in the fourth subpixel P4. The anode electrode 120 is not provided in the transmissive area TA.

The anode electrode 120 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO, MoTi alloy and a deposited structure (ITO/MoTi alloy/ITO) of MoTi alloy and ITO. The Ag alloy may be an alloy of silver (Ag), palladium (Pb), and Copper (Cu). The MoTi alloy may be an alloy of molybdenum (Mo) and titanium (Ti).

A bank 125 may be provided over the planarization film PLN. Also, the bank 125 may be provided between the anode electrodes 120. The bank 125 may be formed to cover or at least partially cover an edge of each of the anode electrodes 120. Therefore, the bank 125 may prevent light emission efficiency from being deteriorated due to a current concentrated on an end of each of the anode electrodes 120.

The bank 125 may respectively define emission areas EA1, EA2, EA3 and EA4 of the subpixels P1, P2, P3 and P4. Each of the emission areas EA1, EA2, EA3 and EA4 of the subpixels P1, P2, P3 and P4 indicates an area where the anode electrode 120, the organic light emitting layer 130 and the cathode electrode 140 are sequentially deposited and then holes from the anode electrode 120 and electrons from the cathode electrode 140 are combined with each other in the organic light emitting layer 130 to emit light. In this case, the area where the bank 125 is not formed and the anode electrode 120 is exposed may be an emission area EA, and the other area may be a non-emission area NEA.

The bank 125 may be formed of an organic layer, for example, acryl resin, epoxy resin, phenolic resin, polyamide resin, polyimide resin, etc.

The organic light emitting layer 130 may be provided over the anode electrode 120. The organic light emitting layer 130 may include a hole transporting layer, a light emitting layer, and an electron transporting layer. In this case, if a voltage is applied to the anode electrode 120 and the cathode electrode 140, holes and electrons move to the light emitting layer through the hole transporting layer and the electron transporting layer, respectively, and are combined with each other in the light emitting layer to emit light.

In one embodiment, the organic light emitting layer 130 may be a common layer commonly formed for the subpixels P1, P2, P3 and P4. For example, the organic light emitting layer 130 may be a white light emitting layer emitting white light.

In another embodiment, the organic light emitting layer 130 may include light emitting layers formed per subpixels P1, P2, P3 and P4. For example, a green light emitting layer emitting green light may be formed in the first subpixel P1, a red light emitting layer emitting red light may be formed in the second subpixel P2, a blue light emitting layer emitting blue light may be formed in the third subpixel P3, and a white light emitting layer emitting white light may be formed in the fourth subpixel P4. In this case, the light emitting layers of the organic light emitting layer 130 are not formed in the transmissive area TA.

The cathode electrode 140 may be provided over the organic light emitting layer 130 and the bank 125. The cathode electrode 140 may be provided in the transmissive area TA as well as the non-transmissive area NTA that includes the emission area EA, but is not limited thereto. The cathode electrode 140 may be provided only in the non-transmissive area NTA that includes the emission area EA, but may not be provided in the transmissive area TA to improve transmittance.

The cathode electrode 140 may be a common layer commonly formed in the subpixels P1, P2 and P3 to apply the same voltage. The cathode electrode 140 may be formed of a conductive material that may transmit light. For example, the cathode electrode 140 may be formed of a low resistance metal material, for example, Ag, or alloy of Mg and Ag.

An encapsulation layer 150 may be provided over the light emitting diodes. The encapsulation layer 150 may be formed over the cathode electrode 140 to overlay the cathode electrode 140. The encapsulation layer 150 serves to prevent oxygen or water from being permeated into the organic light emitting layer 130 and the cathode electrode 140. To this end, the encapsulation layer 150 may include at least one inorganic layer and at least one organic layer.

Meanwhile, although not shown in FIG. 5 and FIG. 6, a capping layer may additionally be formed between the cathode electrode 140 and the encapsulation layer 150.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer 160. At this time, the adhesive layer 160 may be an optically clear resin (OCR) layer or an optically clear adhesive (OCA) film.

The color filter CF may be formed to be patterned for each of the subpixels P1, P2, P3 and P4. In detail, the color filter CF may include a first color filter CF1, a second color filter CF2, and a third color filter CF3. The first color filter CF1 may be disposed to correspond to the emission area EA1 of the first subpixel P1, and may be a green color filter that transmits green light. The second color filter CF2 may be disposed to correspond to the emission area EA2 of the second subpixel P2, and may be a red color filter that transmits red light. The third color filter CF3 may be disposed to correspond to the emission area EA3 of the third subpixel P3, and may be a blue color filter that transmits blue light.

In the transparent display panel 110 according to one embodiment of the present disclosure, a polarizer is not used, and the color filter CF is formed in the second substrate 112. When the polarizer is attached to the transparent display panel 110, transmittance of the transparent display panel 110 is reduced by the polarizer. When the polarizer is not attached to the transparent display panel 110, a problem occurs in that externally incident light is reflected in the electrodes.

The transparent display panel 110 according to one embodiment of the present disclosure may prevent transmittance from being reduced as a polarizer is not attached thereto. Also, in the transparent display panel 110 according to one embodiment of the present disclosure, the color filter CF may be formed in the second substrate 112 to partially absorb externally incident light, thereby preventing the incident light from being reflected in the electrodes. That is, the transparent display panel 110 according to one embodiment of the present disclosure may reduce external light reflectance without reducing transmittance.

Meanwhile, a black matrix BM may be provided among color filters CF1, CF2 and CF3. The black matrix BM may be provided among the subpixels P1, P2 and P3 to prevent color mixture from occurring among the subpixels P1, P2 and P3 adjacent to one another. Also, the black matrix BM may prevent externally incident light from being reflected in a plurality of lines provided among the subpixels P1, P2 and P3, for example, scan lines, data lines, pixel power lines, common power lines, reference lines, etc.

The black matrix BM may include a material that absorbs light, for example, a black dye that fully absorbs light of a visible light wavelength range.

Hereinafter, an example that the first signal line SL1, the second signal line SL2, and the driving transistor TR are disposed will be described with reference to FIGS. 4 to 6.

As described above, the display area DA includes a transmissive area TA and a non-transmissive area NTA. The non-transmissive area NTA includes a first non-transmissive area NTA1 extended between adjacent transmissive areas TA in the first direction (e.g., Y-axis direction), and a second non-transmissive area NTA2 extended between adjacent transmissive areas TA in the second direction (e.g., X-axis direction).

The first signal line SL1 and driving transistors TR1 and TR2 of the subpixels P1 and P2 disposed to overlap at least a part of the first signal line SL1 may be disposed in the first non-transmissive area NTA1. For example, the first and second subpixels P1 and P2 may be disposed to overlap at least a part of the first signal line SL1 and alternately disposed along the first signal line SL1. The first signal line SL1, the first driving transistor TR1 of the first subpixel P1 and the second driving transistor TR2 of the second subpixel P2 may be disposed in the first non-transmissive area NTA1.

The first signal line SL1 may be provided in the first non-transmissive area NTA1 and extended in the first direction (e.g., Y-axis direction). The first signal line SL1 may include a plurality of signal lines, and may include, for example, the first data line DL1, the reference line REFL, and the second data line DL2.

In detail, the reference line REFL may be provided in the first non-transmissive area NTA1 and extended in the first direction (e.g., Y-axis direction). The reference line REFL may supply a reference voltage (or initialization voltage or sensing voltage) to the driving transistor TR of each of the subpixels P1, P2, P3 and P4 provided in the display area DA.

The first data line DL1 may be provided in the first non-transmissive area NTA1, disposed at a first side of the reference line REFL and extended in the first direction (e.g., Y-axis direction). The first data line DL1 may supply the data voltage to at least a portion of the subpixels P1, P2, P3 and P4 provided in the display area DA.

For example, the first data line DL1 may supply a first data voltage to the second driving transistor TR2 of the second subpixel P2 and a third driving transistor TR3 of the third subpixel P3, which are disposed at the first side of the reference line REFL.

The second data line DL2 may be provided in the first non-transmissive area NTA1, disposed at a second side of the reference line REFL and extended in the first direction (Y-axis direction). At this time, the second side of the reference line REFL may be a side facing the first side. For example, when the first side is a left side, the second side may be a right side of the reference line REFL. The second data line DL2 may supply the data voltage to the other subpixels except the subpixel connected with the first data line DL2, among the subpixels P1, P2, P3 and P4 provided in the display area DA.

For example, the second data line DL2 may supply a second data voltage to the first driving transistor TR1 of the first subpixel P1 and a fourth driving transistor TR4 of the fourth subpixel P4, which are disposed at the second side of the reference line REFL.

The first signal line SL1 may further include a first power line and a second power line.

The first power line may be provided in the first non-transmissive area NTA1, disposed between the reference line REFL and the first data line DL1 and extended in the first direction (Y-axis direction).

The second power line may be provided in the first non-transmissive area NTA1, disposed between the reference line REFL and the second data line DL2 and extended in the first direction (Y-axis direction).

In one embodiment, one of the first power line and the second power line may be the pixel power line VDDL for supplying a first power source to the anode electrode 120 of each of the subpixels P1, P2, P3 and P4. In one embodiment, one of the first power line and the second power line may be the common power line VSSL for supplying a second power source to a cathode electrode 140 of each of the subpixels P1, P2, P3 and P4.

The transparent display panel 110 according to one embodiment of the present disclosure is characterized in that the reference line REFL is not disposed to be adjacent to the first and second data lines DL1 and DL2.

A certain voltage is applied to the reference line REFL, whereas the data voltage may be applied to the data lines DL1 and DL2 in the form of a pulse. In the case that the reference line REFL is disposed to be adjacent to the data lines DL1 and DL2, crosstalk caused by capacitive coupling may occur between the reference line REFL and the data lines DL1 and DL2 when voltage variation occurs in the data lines DL1 and DL2. In this case, a voltage of the reference line REFL may be varied, and further, luminance of the subpixels P1, P2, P3 and P4 may be changed. For this reason, a dark line or a bright line may occur.

The transparent display panel 110 may be provided with a transmissive area TA of a wide size to make sure of light transmittance, and may be provided with a non-transmissive area NTA of a relatively narrow size. The plurality of signal lines do not have transmittance, and thus may be disposed in the non-transmissive area NTA. At this time, in the transparent display panel 110, since the plurality of signal lines are disposed in the non-transmissive area NTA of a narrower size than a general display panel, a spaced distance between the signal lines has no choice but to be short. For this reason, in the transparent display panel 110, parasitic capacitance between the reference line REFL and the data lines DL1 and DL2 may be increased, and crosstalk caused by coupling may occur more seriously.

In the transparent display panel 110 according to one embodiment of the present disclosure, in order to reduce or minimize parasitic capacitance between the reference line REFL and the data lines DL1 and DL2 in a limited space, the reference line REFL may not be disposed to be adjacent to the data lines DL1 and DL2.

In detail, in the transparent display panel 110 according to one embodiment of the present disclosure, the pixel power line VDDL or the common power line VSSL may be disposed between the reference line REFL and the first data line DL1, whereby the reference line REFL and the first data line DL1 may not be disposed to be adjacent to each other. Also, in the transparent display panel 110 according to one embodiment of the present disclosure, the pixel power line VDDL or the common power line VSSL may be disposed between the reference line REFL and the second data line DL2, whereby the reference line REFL and the second data line DL2 may not be disposed to be adjacent to each other. Since a certain power voltage not a pulse type is applied to the pixel power line VDDL or the common power line VSSL, the pixel power line VDDL or the common power line VSSL may less affect the reference line REFL.

That is, in the transparent display panel 110 according to one embodiment of the present disclosure, different signal lines may be disposed between the reference line REFL and the data line DL1 and DL2, whereby the spaced distance between the reference line REFL and the data lines DL1 and DL2 may be increased. Therefore, in the transparent display panel 110 according to one embodiment of the present disclosure, parasitic capacitance between the reference line REFL and the data lines DL1 and DL2 may be reduced.

Meanwhile, in the transparent display panel 110 according to one embodiment of the present disclosure, the reference line REFL and the data lines DL1 and DL2 may be provided in their respective layers different from each other. In detail, the reference line REFL may be provided over a first layer, and the data lines DL1 and DL2 may be disposed over a second layer different from the first layer.

In one embodiment, the reference line REFL may be provided over the same layer as one of elements constituting the driving transistor TR. In detail, the reference line REFL may be provided on the same layer as any one of the active layer ACT, the gate electrode GE, the source electrode SE and the drain electrode DE of the driving transistor TR. For example, the reference line REFL may be provided on the same layer as the gate electrode GE as shown in FIG. 5.

In one embodiment, the data lines DL1 and DL2 may be provided between the driving transistor TR and the substrate 111. For example, the data lines DL1 and DL2 may be provided on the same layer as the light shielding layer LS as shown in FIG. 5.

In the transparent display panel 110 according to one embodiment of the present disclosure, the reference line REFL and the data lines DL1 and DL2 may be provided in their respective layers different from each other, whereby the spaced distance between the reference line REFL and the data lines DL1 and DL2 may be maximized in a limited space. Therefore, in the transparent display panel 110 according to one embodiment of the present disclosure, parasitic capacitance between the reference line REFL and the data lines DL1 and DL2 may be reduced or minimized.

Meanwhile, the first driving transistor TR1 and the second driving transistor TR2 may not be provided on a straight line but be provided in the form of a zigzag. In detail, as shown in FIG. 4, the first driving transistor TR1 may be disposed at one side of a first center line CL1 parallel with the first direction (Y-axis direction) in the first non-transmissive area NTA1, and the second driving transistor TR2 may be disposed at the other side of the first center line CL1.

That is, the first driving transistor TR1 may be disposed at the second side of the reference line REFL, and may be provided between the second data line DL2 and the transmissive area TA. The second driving transistor TR2 may be disposed at the first side of the reference line REFL, and may be provided between the first data line DL1 and the transmissive area TA.

The transparent display panel 110 according to one embodiment of the present disclosure is characterized in that the first driving transistor TR1 and the second driving transistor TR2 are disposed in the form of a zigzag.

For example, it is assumed that the first driving transistor TR1 and the second driving transistor TR2 are disposed on a straight line at the first side of the reference line REFL.

The first driving transistor TR1 may be connected to the first data line DL1, and the second driving transistor TR2 may be connected to the second data line DL2. At this time, a connection line for connecting the second driving transistor TR2 with the second data line DL2 should cross the first data line DL1, the pixel power line VDDL, the reference line REFL and the common power line VSSL. Therefore, a length of the connection line for connecting the second driving transistor TR2 with the second data line DL2 may be long, and loss may occur in the data voltage due to resistance.

Also, since the length of the connection line for connecting the first driving transistor TR1 with the first data line DL1 is different from that of the connection line for connecting the second driving transistor TR2 with the second data line DL2, deviation may occur in the data voltage.

In the transparent display panel 110 according to one embodiment of the present disclosure, the first driving transistor TR1 and the second driving transistor TR2 may be disposed in the form of a zigzag such that the connection line for connecting the first driving transistor TR1 with the first data line DL1 may have a length the same as or similar to that of the connection line for connecting the second driving transistor TR2 with the second data line DL2.

Therefore, in the transparent display panel 110 according to one embodiment of the present disclosure, deviation may be prevented from occurring in the signal voltage applied to each of the first driving transistor TR1 and the second driving transistor TR2.

Also, in the transparent display panel 110 according to one embodiment of the present disclosure, lengths of connection lines for connecting the first signal line SL1 with the first and second driving transistors TR1 and TR2 may be reduced or minimized. In the transparent display panel 110 according to one embodiment of the present disclosure, loss may be prevented from occurring in the signal voltage such as the data voltage.

The second signal line SL2 and driving transistors TR3 and TR4 of the subpixels P3 and P4 disposed to overlap at least a part of the second signal line SL2 may be disposed in the second non-transmissive area NTA2. For example, the third and fourth subpixels P3 and P4 may be disposed to overlap at least a part of the second signal line SL2 and alternately disposed along the second signal line SL2. The second signal line SL2, the third driving transistor TR3 of the third subpixel P3 and the fourth driving transistor TR4 of the fourth subpixel P4 may be disposed in the second non-transmissive area NTA2.

The second signal line SL2 may be provided in the second non-transmissive area NTA2 and extended in the second direction (X-axis direction). The second signal line SL2 may include a plurality of signal lines, and may include, for example, at least one scan line SCANL1 and SCANL2.

Hereinafter, the case that two scan lines SCANL1 and SCANL2 are provided in the second non-transmissive area NTA2 will be described, but the present disclosure is not limited thereto. Only one scan line may be provided in the second non-transmissive area NTA2.

In detail, the first scan line SCANL1 may be provided in the second non-transmissive area NTA2 and extended in the second direction (X-axis direction). The first scan line SCANL1 may supply a scan signal to at least a portion of the subpixels P1, P2, P3 and P4 provided in the display area DA.

For example, the first scan line SCANL1 may supply a first scan signal to the first driving transistor TR1 of the first subpixel P1 and the third driving transistor TR3 of the third subpixel P3.

The second scan line SCANL2 may be provided in the second non-transmissive area NTA2 and extended in the second direction (X-axis direction). The second scan line SCANL2 may supply the scan signal to the other subpixels except the subpixel connected with the first scan line SCANL2, among the subpixels P1, P2, P3 and P4 provided in the display area DA.

For example, the second scan line SCANL2 may supply a second scan signal to the second driving transistor TR2 of the second subpixel P2 and the fourth driving transistor TR4 of the fourth subpixel P4.

The first and second scan lines SCANL1 and SCANL2 may be formed on a layer different from the first signal line SL1. In detail, the first and second scan lines SCANL1 and SCANL2 may be formed on a layer different from the first data line DL1, the reference line REFL and the second data line DL2.

In one embodiment, the first and second scan lines SCANL1 and SCANL2 may be provided on the same layer as one of elements constituting the driving transistor TR. In detail, the first and second scan lines SCANL1 and SCANL2 may be provided on the same layer as any one of the active layer ACT, the gate electrode GE, the source electrode SE and the drain electrode DE of the driving transistor TR. For example, the first and second scan lines SCANL1 and SCANL2 may be provided on the same layer as the source electrode SE and the drain electrode DE as shown in FIG. 6.

The first signal line SL1 and the second signal line SL2 described as above may cross or overlap each other in an intersection area IA where the first non-transmissive area NTA1 and the second non-transmissive area NTA2 cross or overlap each other. Short may occur in the intersection area IA of the first signal line SL1 and the second signal line SL2.

Particularly, it is likely that short occurs in the signal line formed on the same layer as the gate electrode GE and the signal line formed on the same layer as the source electrode SE and the drain electrode DE due to particles.

In accordance with one embodiment, when the reference line REFL is formed on the same layer as the gate electrode GE of the driving transistor TR and the scan lines SCANL1 and SCANL2 are formed on the same layer as the source electrode SE and the drain electrode DE of the driving transistor TR, short may occur in the reference line REFL and the scan lines SCANL1 and SCANL2 due to particles.

The transparent display panel 110 according to one embodiment of the present disclosure is characterized in that a repair structure is applied to the scan lines SCANL1 and SCANL2 to repair the reference line REFL and the scan lines SCANL1 and SCANL2 when short occurs in the reference line REFL and the scan lines SCANL1 and SCANL2.

Hereinafter, an example that the reference line REFL and the scan lines SCANL1 and SCANL2 are disposed in the intersection area IA will be described with reference to FIGS. 4 and 7.

The reference line REFL may include a first line portion RL1, a second line portion RL2 and a bent portion RL3.

The first line portion RL1 may be disposed at a first side of the first center line CL1 parallel with the first direction (Y-axis direction) in the first non-transmissive area NTA1, and the second line portion RL2 may be disposed at a second side of the first center line CL1.

The bent portion RL3 may be bent in the intersection area IA where the first non-transmissive area NTA1 and the second non-transmissive area NTA2 cross or overlap each other, thereby connecting the first line portion RL1 with the second line portion RL2. The bent portion RL3 may be formed to be inclined with respect to a second center line CL2 parallel with the second direction (X-axis direction) in the second non-transmissive area NTA2 as shown in FIGS. 4 and 7.

Each of the first and second scan lines SCANL1 and SCANL2 may include a first line portion SCL1 portion, a second line portion SCL2, and a connection line portion SCL3.

The first line portion SCL1 may be disposed at the first side of the reference line REFL, and the second line portion SCL2 may be disposed at the second side of the reference line REFL.

The connection line portion SCL3 may be provided in the intersection area IA where the first non-transmissive area NTA1 and the second non-transmissive area NTA2 cross or overlap each other, and may connect the first line portion SCL1 with the second line portion SCL2. The connection line portion SCL3 may include a plurality of divergence lines SCL3-2 as shown in FIGS. 4 and 7.

In detail, the connection line portion SCL3 may dispose the plurality of divergence lines SCL3-2 in an area crossing the bent portion RL3 of the reference line REFL. Each of the plurality of divergence lines SCL3-2 may have a first length L1, and at least a portion of each divergence line SCL3-2 may be overlapped with the bent portion RL3 of the reference line REFL. The respective divergence lines SCL3-2 may be disposed to be spaced apart from each other.

FIG. 7 shows that the plurality of divergence lines SCL3-2 are, but not limited to, two. The plurality of divergence lines SCL3-2 may be formed to be more than two.

The connection line portion SCL3 may further include a plurality of sub connection line portions SCL3-1, SCL3-3 and SCL3-4 connecting the first line portion SCL1 with the plurality of divergence lines SCL3-2 or connecting the second line portion SCL2 with the plurality of divergence lines SCL3-2. The plurality of sub connection line portions SCL3-1, SCL3-3 and SCL3-4 may be formed to be inclined or parallel with respect to the second center line CL2 as shown in FIGS. 4 and 7.

The scan lines SCANL1 and SCANL2 according to one embodiment of the present disclosure are formed with the plurality of divergence lines SCL3-2 in an area crossing the bent portion RL3 of the reference line REFL. In the transparent display panel 110 according to one embodiment of the present disclosure, when short occurs between any one of the plurality of divergence lines SCL3-2 and the bent portion RL3 of the reference line REFL, the corresponding divergence line SCL3-2 may be cut by a laser to be separated from the sub connection line portions SCL3-1, SCL3-3 and SCL3-4 and then repaired.

In FIGS. 4 and 7, the bent portion RL3 of the reference line REFL is inclined with respect to the second center line CL2, but is not limited thereto. The bent portion RL3 of the reference line REFL may be provided to be parallel with the second center line CL2.

Figure 8:
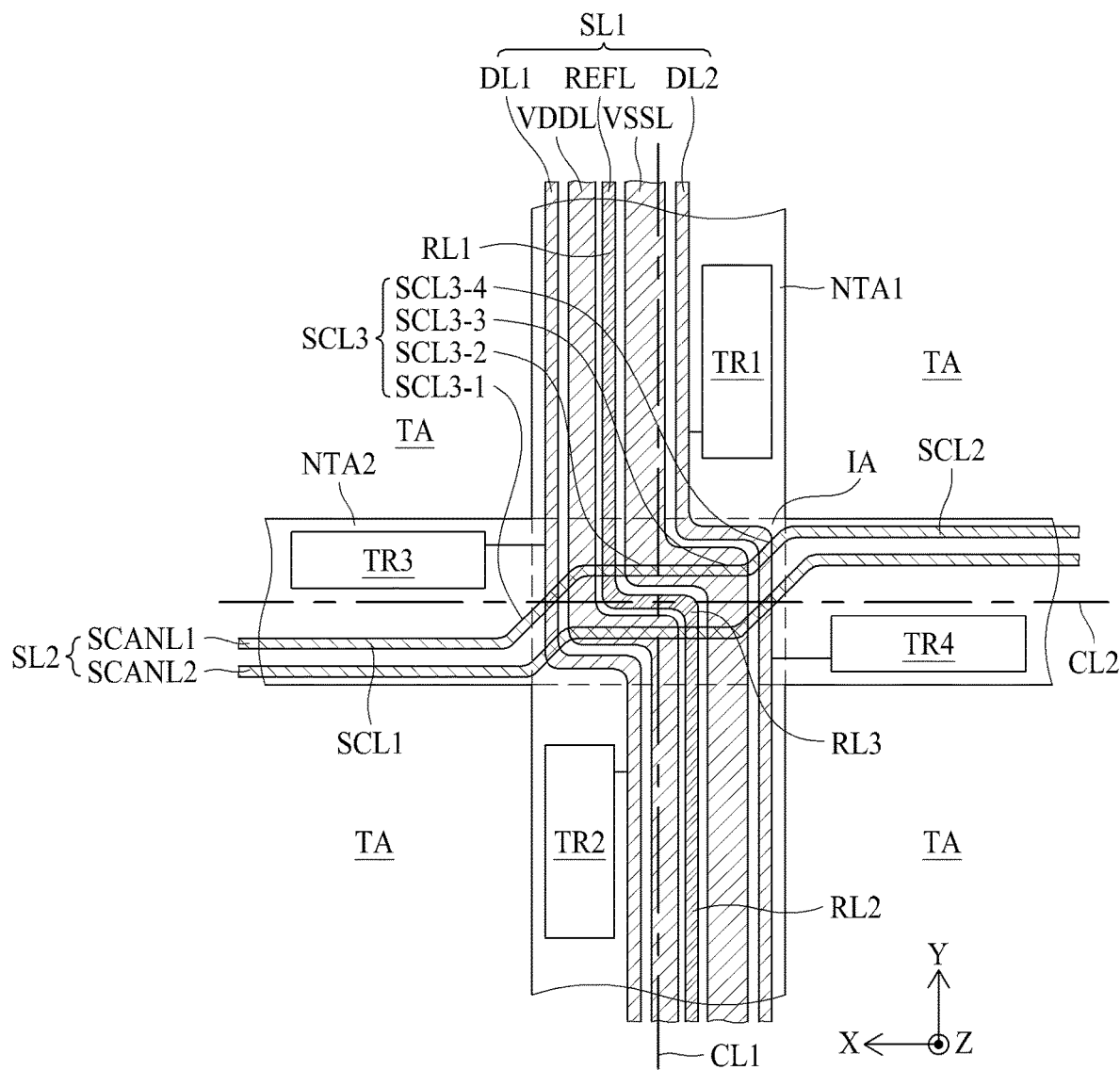
FIG. 8 is a view illustrating another example that a plurality of signal lines and a plurality of driving transistors are disposed.
Figure 9:
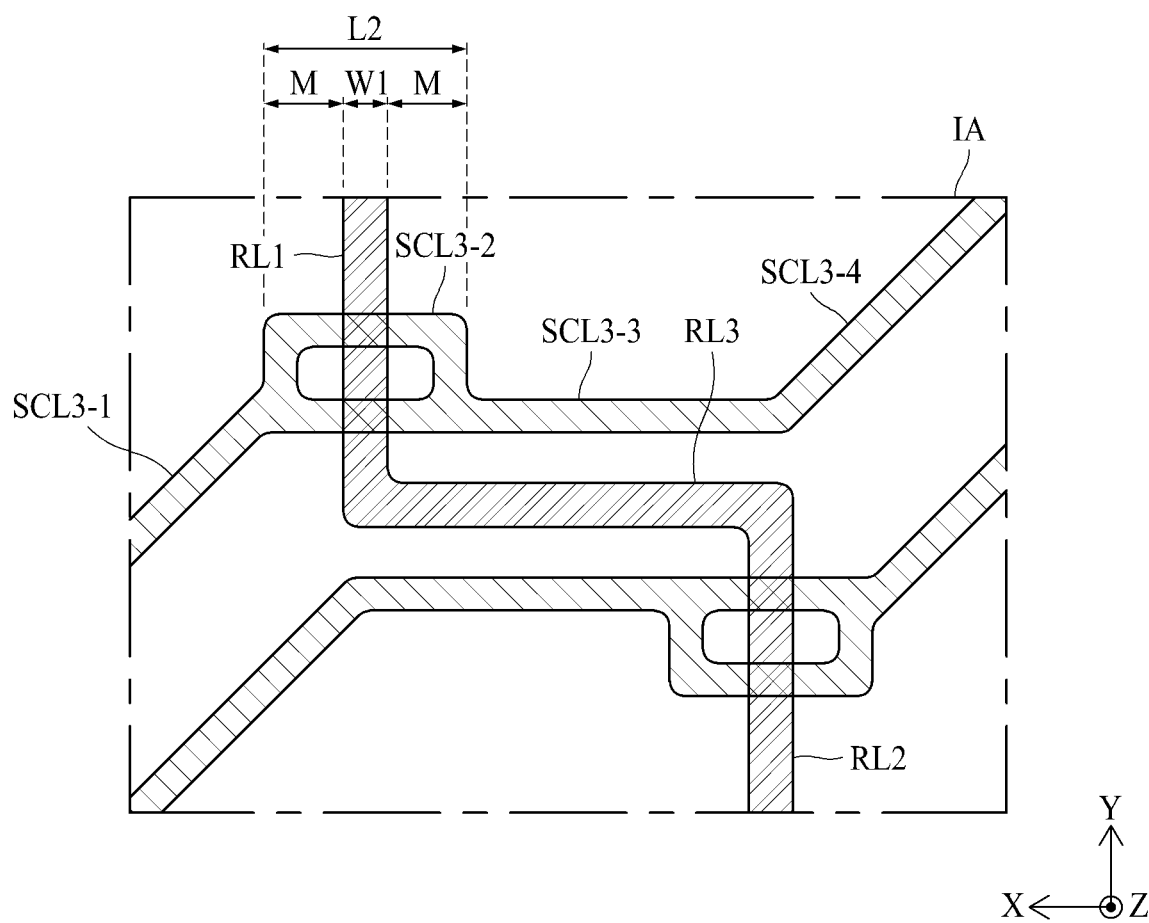
FIG. 9 is a view illustrating another example that a reference line and a scan line are disposed in an intersection area.

FIG. 8 is a view illustrating another example that a plurality of signal lines and a plurality of driving transistors are disposed, and FIG. 9 is a view illustrating another example that a reference line and a scan line are disposed in an intersection area.

Hereinafter, a repeated description will be omitted, and the reference line REFL and the scan lines SCANL1 and SCANL2 will mainly be described.

Referring to FIGS. 8 and 9, the reference line REFL may include a first line portion RL1, a second line portion RL2 and a bent portion RL3.

The first line portion RL1 may be disposed at a first side of the first center line CL1 parallel with the first direction (Y-axis direction) in the first non-transmissive area NTA1, and the second line portion RL2 may be disposed at a second side of the first center line CL1.

The bent portion RL3 may be bent in the intersection area IA where the first non-transmissive area NTA1 and the second non-transmissive area NTA2 cross or overlap each other, thereby connecting the first line portion RL1 with the second line portion RL2. The bent portion RL3 may connect one end of the first line portion RL1 with one end of the second line portion RL2.

The bent portion RL3, as shown in FIGS. 8 and 9, may be formed to be parallel with the second center line CL2. In this case, the first line portion RL1 and the second line portion RL2 may be extended to the intersection area IA. One end of the first line portion RL1 and one end of the second line portion RL2 may have the same distance to the second center line CL2.

Each of the scan lines SCANL1 and SCANL2 may include a first line portion SCL1 portion, a second line portion SCL2, and a connection line portion SCL3.

The first line portion SCL1 may be disposed at the first side of the reference line REFL, and the second line portion SCL2 may be disposed at the second side of the reference line REFL.

The connection line portion SCL3 may be provided in the intersection area IA where the first non-transmissive area NTA1 and the second non-transmissive area NTA2 cross or overlap each other, and may connect the first line portion SCL1 with the second line portion SCL2.

The connection line portion SCL3 may include a plurality of divergence lines SCL3-2 as shown in FIGS. 8 and 9.

In detail, each of the plurality of divergence lines SCL3-2 may cross or overlap any one of the first line portion RL1 and the second line portion SL2 of the reference line REFL. For example, when the plurality of divergence lines SCL3-2 are two, one divergence line SCL3-2 may have a second length L2 and at least a portion thereof may be overlapped with the first line portion RL1. The other one divergence line SCL3-2 may be spaced apart from one divergence line SCL3-2, may have a second length L2, and at least a portion thereof may be overlapped with the second line portion SL2.

FIG. 9 shows that the plurality of divergence lines SCL3-2 are, but not limited to, two. The plurality of divergence lines SCL3-2 may be formed to be more than two.

The connection line portion SCL3 may further include a plurality of sub connection line portions SCL3-1, SCL3-3 and SCL3-4 connecting the first line portion SCL1 with the plurality of divergence lines SCL3-2 or connecting the second line portion SCL2 with the plurality of divergence lines SCL3-2. The plurality of sub connection line portions SCL3-1, SCL3-3 and SCL3-4 may be formed to be inclined or parallel with respect to the second center line CL2 as shown in FIGS. 8 and 9.

The scan lines SCANL1 and SCANL2 according to another embodiment of the present disclosure are formed with the plurality of divergence lines SCL3-2 in an area crossing the bent portion RL3 of the reference line REFL. In the transparent display panel 110 according to one embodiment of the present disclosure, when short occurs between any one of the plurality of divergence lines SCL3-2 and the bent portion RL3 of the reference line REFL, the corresponding divergence line SCL3-2 may be cut by a laser to be separated from the sub connection line portions SCL3-1, SCL3-3 and SCL3-4 and then repaired.

Meanwhile, the bent portion RL3 of the reference line REFL according to another embodiment of the present disclosure may be formed to be parallel with the second center line CL2, whereby a length of the divergence lines SCL3-2 of the scan lines SCANL1 and SCANL2 may be reduced or minimized.

In detail, a minimum margin width M from the reference line REFL is required for laser cutting with respect to the divergence line SCL3-2 when short occurs.

One divergence line SCL3-2 of the scan lines SCANL1 and SCANL2 shown in FIG. 7 needs to make sure of a minimum margin width M at one side, for example, left side of the reference line REFL, and the other one divergence line SCL3-2 needs to make sure of a minimum margin width M at the other side, for example, right side of the reference line REFL.

Since the bent portion RL3 of the reference line REFL shown in FIG. 7 is inclined with respect to the second center line CL2, a width W2 between the minimum margin width M at the left side and the minimum margin width M at the right side is greater than a width W1 of the reference line REFL.

Meanwhile, the bent portion RL3 of the reference line REFL shown in FIG. 9 is parallel with the second center line CL2, and the divergence lines SCL3-2 of the scan lines SCANL1 and SCANL2 cross or overlap the first line portion RL1 or the second line portion RL2 disposed to be perpendicular to the second center line CL2. In this case, a width between the minimum margin width M at the left side and the minimum margin width M at the right side may be equal to the width W1 of the reference line REFL.

As a result, the length L2 of the divergence lines SCL3-2 of the scan lines SCANL1 and SCANL2 shown in FIG. 9 may be shorter than the length L1 of the divergence lines SCL3-2 of the scan lines SCANL1 and SCANL2. The scan lines SCANL1 and SCANL2 according to another embodiment of the present disclosure may easily apply a repair structure to a limited space and improve the degree of freedom in design by minimizing the length of the divergence lines SCL3-2.

According to the present disclosure, the following advantageous effects may be obtained.

As different signal lines are disposed between the reference line and the data line, the spaced distance between the reference line and the data line may be increased. Therefore, parasitic capacitance between the reference line and the data line may be reduced.

Also, in the present disclosure, the driving transistors are disposed in the form of a zigzag and the first signal line has also a zigzag shape by including the bent portion, whereby deviation may be prevented from occurring in the signal voltage applied to each of the driving transistors.

Also, the present disclosure may reduce or minimize the length of the connection lines for connecting the first signal line with the driving transistor. Therefore, the present disclosure may prevent loss from occurring in the signal voltage such as the data voltage.

Also, in the present disclosure, the scan line may be formed with the plurality of divergence lines in the area crossing the reference line. Therefore, when short occurs between any one of the plurality of divergence lines and the reference line, the corresponding divergence line may be cut by a laser and then repaired.

Also, in the present disclosure, the bent portion of the reference line may be formed to be parallel with the second center line, whereby the length of the plurality of divergence lines provided in the scan line may be reduced or minimized. Therefore, in the present disclosure, a repair structure of the scan line may easily be applied to a limited space, and the degree of freedom in design may be improved.

It will be apparent to those skilled in the art that the present disclosure described above is not limited by the above-described embodiments and the accompanying drawings and that various substitutions, modifications, and variations can be made in the present disclosure without departing from the spirit or scope of the disclosures.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
a substrate including transmissive areas and a non-transmissive area between the transmissive areas, the non-transmissive area including an emission area;
a plurality of light emitting diodes disposed in the emission area of the non-transmissive area;
a reference line extended from the non-transmissive area in a first direction;
a first data line disposed at a first side of the reference line;
a second data line disposed at a second side of the reference line;
a first power line provided between the reference line and the first data line; and
a second power line provided between the reference line and the second data line,
wherein the emission area of the non-transmissive area overlaps with at least one of the first power line or the second power line from a plan view.

2. The transparent display device of claim 1, wherein the reference line is provided on a layer different from the first data line and the second data line.

3. The transparent display device of claim 2, further comprising a driving transistor disposed over the substrate in the non-transmissive area, the driving transistor including an active layer, a gate electrode, a source electrode, and a drain electrode,
wherein the reference line is provided on a same layer as any one of the active layer, the gate electrode, the source electrode, or the drain electrode, and
wherein the first data line and the second data line are provided between the substrate and the driving transistor.

4. The transparent display device of claim 1, wherein each of the plurality of light emitting diodes includes an anode electrode, a light emitting layer, and a cathode electrode, wherein one of the first power line and the second power line is a pixel power line supplying a first power source to the anode electrode of each of the plurality of light emitting diodes.

5. The transparent display device of claim 4, wherein the other one of the first power line or the second power line is a common power line supplying a second power source to the cathode electrode of each of the light emitting diodes.

6. The transparent display device of claim 1, further comprising:
a first driving transistor disposed at the second side of the reference line and provided between the second data line and the transmissive area; and
a second driving transistor disposed at the first side of the reference line and provided between the first data line and the transmissive area.

7. The transparent display device of claim 6, wherein the first driving transistor and the second driving transistor are provided in the non-transmissive area and alternately disposed along the first direction.

8. The transparent display device of claim 1, wherein the non-transmissive area includes a first non-transmissive area extended in the first direction between the transmissive areas and a second non-transmissive area extended in a second direction between the transmissive areas, and the reference line includes a bent portion bent in an area where the first non-transmissive area and the second non-transmissive area overlap each other.

9. The transparent display device of claim 8, wherein the bent portion is provided to be parallel with the second non-transmissive area.

10. The transparent display device of claim 8, further comprising a scan line extended from the second non-transmissive area in the second direction, wherein the scan line is provided on a layer different from the reference line.

11. The transparent display device of claim 10, wherein the scan line includes a first line portion disposed at the first side of the reference line, a second line portion disposed at the second side of the reference line, and a connection line portion connecting the first line portion with the second line portion, and the connection line portion includes a plurality of divergence lines.

12. The transparent display device of claim 11, wherein the plurality of divergence lines overlap at least a portion of the bent portion of the reference line in the area where the first non-transmissive area and the second non-transmissive area overlap each other.

13. A transparent display device comprising:
a substrate including transmissive areas, a first non-transmissive area extended in a first direction between the transmissive areas, and a second non-transmissive area extended in a second direction between the transmissive areas, the first non-transmissive area including a first emission area and the second non-transmissive area including a second emission area;
a plurality of light emitting diodes disposed in the first emission area and the second emission area;

a reference line extending in the first direction in the first non-transmissive area; and a scan line extending in the second direction in the second non-transmissive area, wherein the reference line includes a first line portion disposed at a first side of a first center line parallel with the first direction in the first non-transmissive area, a second line portion disposed at a second side of the first center line, and a bent portion connecting the first line portion with the second line portion, wherein at least one of the first emission area or the second emission area overlaps with the reference line from a plan view.

14. The transparent display device of claim 13, wherein the bent portion is provided in an area where the first non-transmissive area and the second non-transmissive area overlap each other.

15. The transparent display device of claim 13, wherein the bent portion is inclined with respect to a second center line parallel with the second direction in the second non-transmissive area.

16. The transparent display device of claim 13, wherein the bent portion is parallel with a second center line parallel with the second direction in the second non-transmissive area.

17. The transparent display device of claim 13, wherein the reference line is provided on a layer different from the scan line.

18. The transparent display device of claim 17, further comprising a driving transistor disposed over the substrate in the first non-transmissive area and the second non-transmissive area, the driving transistor including an active layer, a gate electrode, a source electrode, and a drain electrode, wherein the reference line is provided on a same layer as the gate electrode, and wherein the scan line is provided on a same layer as the source electrode and the drain electrode.

19. The transparent display device of claim 13, wherein the scan line includes a first line portion disposed at a first side of the reference line, a second line portion disposed at a second side of the reference line, and a connection line portion connecting the first line portion with the second line portion, the connection line including a plurality of divergence lines, and wherein the plurality of divergence lines overlap at least a portion of the bent portion of the reference line in an area where the first non-transmissive area and the second non-transmissive area overlap each other.

20. The transparent display device of claim 13, wherein an intersection area is defined where the first non-transmissive area and the second non-transmissive area overlap with each other, and wherein the bent portion of the reference line overlaps with the intersection area from a plan view.

\* \* \* \* \*